United States Patent [19]
Chiriatti et al.

[11] Patent Number: 4,996,451
[45] Date of Patent: Feb. 26, 1991

[54] PROGRAMMABLE STATIC SELECTION CIRCUIT FOR PROGRAMMABLE DEVICES

[75] Inventors: Antonio Chiriatti, Reggio Calabria; Marco Masini, Milan, both of Italy

[73] Assignee: SGS-Thomson Microelectronics srl, Milan, Italy

[21] Appl. No.: 411,661

[22] Filed: Sep. 25, 1989

[30] Foreign Application Priority Data

Oct. 6, 1988 [IT] Italy ................. 22219 A/88

[51] Int. Cl.$^5$ ........................................ H03K 17/22
[52] U.S. Cl. .................... 307/468; 307/469; 307/450
[58] Field of Search ............. 365/185, 206, 230.06; 307/450, 465, 468–469, 362, 570, 272.3

[56] References Cited

U.S. PATENT DOCUMENTS

| | | | |
|---|---|---|---|
| 4,441,172 | 4/1984 | Ebel | 365/226 |
| 4,495,427 | 1/1985 | Cartwright, Jr. | 307/450 X |
| 4,633,107 | 12/1986 | Norsworthy | 307/272.3 |
| 4,656,609 | 4/1987 | Higuchi et al. | 365/230.06 X |
| 4,710,900 | 12/1987 | Higuchi | 365/230.06 X |
| 4,829,203 | 5/1989 | Ashmore, Jr. | 307/465 X |
| 4,835,423 | 5/1989 | de Ferron et al. | 365/226 X |
| 4,870,304 | 9/1984 | Bloker et al. | 307/450 X |
| 4,914,634 | 4/1990 | Akrout et al. | 365/230.06 X |

FOREIGN PATENT DOCUMENTS 0032716  2/1989  Japan ........................... 307/272.3

Primary Examiner—David Hudspeth
Attorney, Agent, or Firm—Wolf, Greenfield & Sacks

[57] ABSTRACT

The circuit comprises: a pair of programmable cells connected in series, one conducting, the other one open, with one free terminal connected to the ground and the opposite free terminal connected to a supply voltage; a threshold circuit having one input connected to the node between the two programmable cells, a switching threshold lower than the difference between the supply voltage and the threshold voltage of one of the programmable cells, and an output adapted to assume one of two logic levels depending on whether the tension on the input is higher or lower than the threshold; and a first transistor which is connected between the ground and the opposite end of the pair of programmable cells, is normally off and has a gate which can be driven to make it conduct.

8 Claims, 1 Drawing Sheet

PROGRAMMABLE STATIC SELECTION CIRCUIT FOR PROGRAMMABLE DEVICES

BACKGROUND OF THE INVENTION

1. Field of the Invention

The present invention relates to a programmable static selection circuit to be included in integrated circuits with programmable cells, such as EPROMs, EEPROMs, FLASHs and the like, for example programmable logic devices (also known as PLDs) and analog or hybrid programmable devices.

2. Prior Art

As is known, PLDs (and other similar devices) perform the required logic functions by appropriately programming arrays of programmable cells, some of which are preset for the once-only selection of accessory conditions, such as the definition of the pins as input or output terminals.

In order to provide such selections, circuits are known which assume one of two different operative conditions depending on the state (virgin or written) of a preset cell of the integrated device. Said circuits must meet, among other things, the requirement of an extremely reduced or even nil power consumption. Known circuits having this purpose typically employ capacitors which occupy a considerable silicon area, and since they reach their operative condition by means of a dynamic operation, in extreme conditions of the operating parameters they can assume an undefined state which prevents the correct operation of the PLD.

SUMMARY OF THE INVENTION

The aim of the invention is therefore to provide a programmable static selection circuit of the above described aim, which has nil power consumption, does not use capacitors and is more reliable than known circuits which have an equivalent function.

This aim, as well as other objects and advantages which will become apparent hereinafter, is achieved by the invention with a programmable static selection circuit for programmable devices, characterized in that it comprises a pair of programmable cells connected in series, one conducting, the other one open, with one free terminal connected to the ground and the opposite free terminal connected to a supply voltage; a threshold circuit having an input connected to the node between said two programmable cells, a switching threshold lower than the difference between said supply voltage and the threshold voltage of one of said programmable cells, and an output adapted to assume one of two logic levels depending on whether the voltage on the input is greater or smaller than said threshold; and a first transistor connected between the ground and said opposite terminal of the pair of programmable cells, said transistor being normally off and having a gate which can be driven to make said transistor conduct.

BRIEF DESCRIPTION OF THE DRAWINGS

The invention is now described in greater detail with reference to a preferred embodiment thereof which relates to a PLD implemented in CMOS technology, shown in the accompanying drawings, given only by way of non-limitative example, wherein.

DETAILED DESCRIPTION OF THE PREFERRED EMBODIMENT

Figure 1:
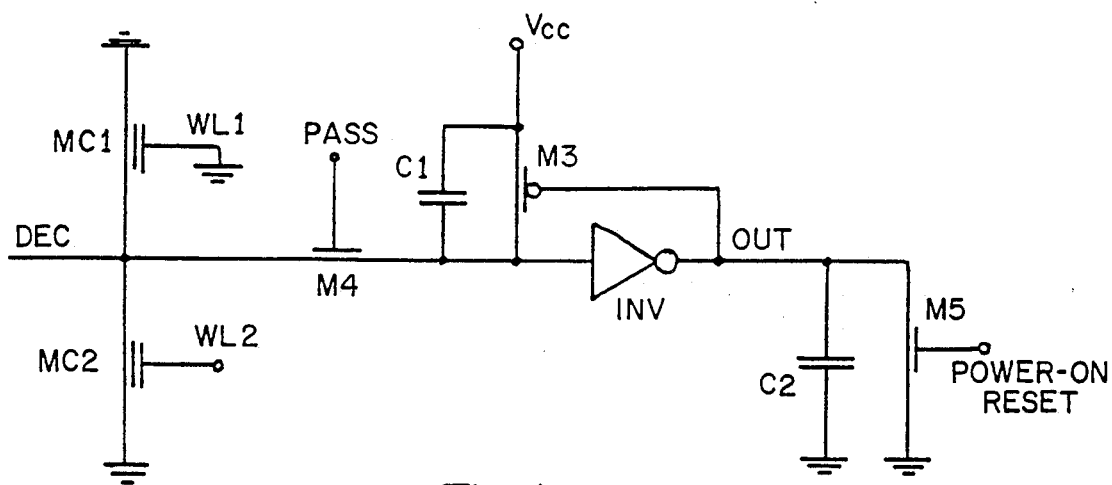
FIG. 1 is a diagram of a known programmable static selection circuit for PLDs.

With reference to FIG. 1, a cell MC2, having a gate controlled by a line WL2 which is normally connected to the power source, has one terminal connected to the ground and the opposite terminal connected to a circuit which comprises an inverter INV which has its input connected to the positive supply voltage $V_{cc}$, through a P-channel transistor M3 in parallel with a capacitor C1, and has its output connected to the ground through the parallel arrangement of an N-channel transistor M5 and a capacitor C2. Said transistor M3 is controlled by the output OUT of the inverter INV, while the transistor M5 is controlled by a power-on reset signal. When the power supply $V_{cc}$ is applied, the circuit assumes one of two operative conditions, high output or low output, depending on whether the cell MC2 conducts or is open.

Figure 2:
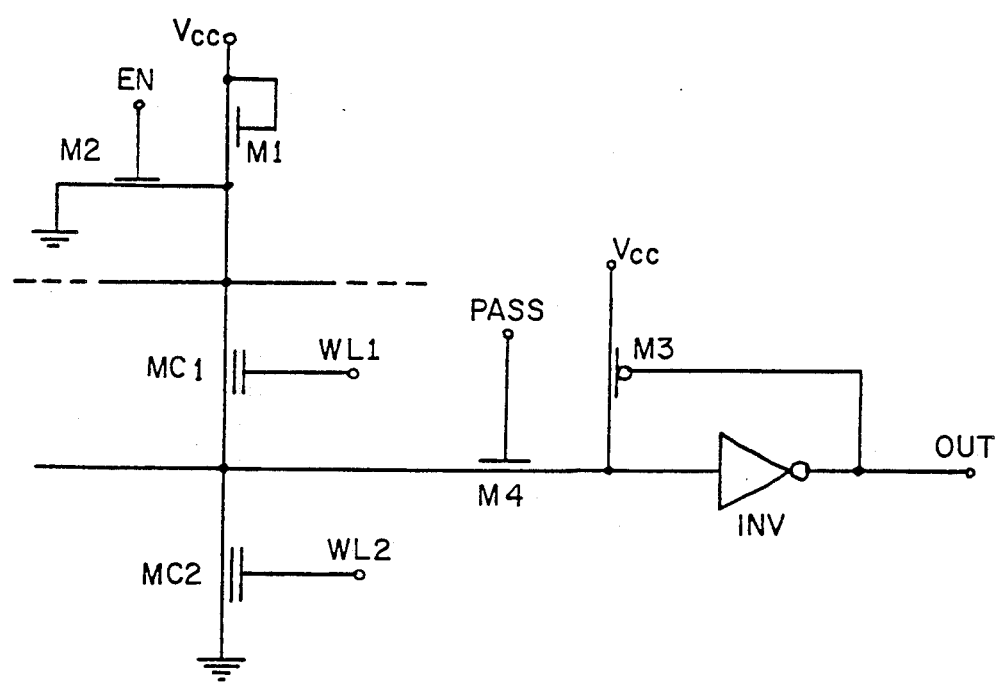
FIG. 2 is a diagram of a preferred embodiment of a programmable static selection circuit according to the invention.

With reference to FIG. 2, which illustrates a circuit according to the preferred embodiment of the invention, a pair of cells MC1 and MC2, which have respective gates controllable by lines WL1, WL2, are connected in series so as to define a voltage divider, with one free terminal connected to the ground and the opposite free terminal connected to a positive supply voltage $V_{cc}$ of 5 V through a diode-connected transistor M1. A second transistor M2 is connected between said opposite terminal and the ground, and its gate is driven by a signal EN with which the transistor M2 can be enabled in order to connect the free terminal of the cell MC1 to the ground when the cells are to be programmed or tested.

The output, or intermediate node, of the voltage divider MC1, MC2 is connected, through a transfer transistor M4, to the input of an inverter INV, the output OUT whereof is fedback to the gate of a P-channel pull-up transistor M3 for the input of the inverter INV.

The two cells MC1, MC2 always have mutually different programming states, i.e. one must conduct when the other is open. If the cell MC2 of the lower branch conducts (and therefore MC1 is open), the output of the divider is be nil; therefore the output OUT of the inverter is high and keeps the pull-up transistor M3 off.

Instead, if MC2 is open (and MC1 conducts), the output of the divider reaches a value equal to the difference between $V_{cc}$ and the cell's threshold voltage. The inverter INV has such dimensions as to have a low switching threshold, safely lower than said value. Thus, in this case, the output OUT is low and enables the pull-up transistor M3 so as to thus raise the input of the inverter to the full logic level.

It can be seen that the inverter INV, together with the transistor M3, constitutes a threshold circuit the output whereof switches from one of two logic levels to the other (i.e. between 0 and $V_{cc}$) depending on whether the input is higher or lower than the threshold voltage.

If the PLD comprises a plurality of programmable circuits of the described kind, which in practice is the norm, the same pair of transistors M1 and M2 can simultaneously feed a plurality of circuits of the above described type.

Though two cells are required for the operation of the described circuit, differently from prior circuits having identical purpose which require a single cell, one should not deduce that the circuit causes a greater use of cells, because since the cells are designed in pairs there is an unused cell even in known circuits in any case. This can also be seen in the circuit of FIG. 1.

A preferred embodiment of the invention has been described, but naturally it is susceptible to modifications and variations which are obvious for the expert in the field according to the given teachings. For example, the threshold circuit which comprises the inverter INV and the transistor M3 may be replaced with another circuit having an equivalent function. The transistor M1, instead of being diode-connected, may furthermore be driven by a signal which makes it conduct when M2 is off and vice versa, or may even be replaced by a resistor or by any other switching or current-limiting device. The polarities of the various transistors may also vary with respect to the illustrated ones.

All the above variations and other functionally equivalent ones must be considered within the scope of the inventive concept as defined by the accompanying claims.

We claim:

1. Programmable static selection circuit for programmable devices, characterized in that it comprises a pair of programmable cells connected in series, one of said cells conducting, the other being open, with one free terminal connected to the ground and the opposite free terminal coupled to a supply voltage; a threshold circuit having an input connected to the node between said two programmable cells, a switching threshold lower than the difference between said supply voltage and the threshold voltage of one of said programmable cells, and an output for assuming one of two logic levels depending on whether the voltage on the input is higher or lower than said threshold; and a first transistor connected between the ground and said opposite terminal of the pair of programmable cells, said transistor being normally off and having a gate which can be driven to make it conduct, wherein load means are connected between said opposite terminal of the pair of programmable cells and said supply voltage.

2. Programmable circuit according to claim 1, characterized in that said threshold circuit is connected to said node between said two cells through a second transfer transistor.

3. Programmable circuit according to claim 1 characterized in that said threshold circuit comprises an inverter which has an output and an input connected to the node between said two programmable cells, and a P-channel transistor which is connected between the supply voltage and the input of the inverter and has a gate connected to the output of the inverter.

4. Programmable circuit according to claim 1 characterized in that the input of the threshold circuit is connected to the node between said two programmable cells through a series-connected transfer transistor.

5. Programmable static selection circuit for programmable devices, characterized in that it comprises a pair of programmable cells connected in series, one of said cells conducting, the other being open, with one free terminal connected to the ground and the opposite free terminal coupled to a supply voltage; a threshold circuit having an input connected to the node between said two programmable cells, a switching threshold lower than the difference between said supply voltage and the threshold voltage of one of said programmable cells, and an output for assuming one of two logic levels depending on whether the voltage on the input is higher or lower than said threshold; and a first transistor connected between the ground and said opposite terminal of the pair of programmable cells, said transistor being normally off and having a gate which can be driven to make it conduct, wherein said opposite terminal is connected to the supply voltage through a current limiter element.

6. Programmable circuit according to claim 5, characterized in that said current limiter element is a resistor.

7. Programmable static selection circuit for programmable devices, characterized in that it comprises a pair of programmable cells connected in series, one of said cells conducting, the other being open, with one free terminal connected to the ground and the opposite free terminal coupled to a supply voltage; a threshold circuit having an input connected to the node between said two programmable cells, a switching threshold lower than the difference between said supply voltage and the threshold voltage of one of said programmable cells, and an output for assuming one or two logic levels depending on whether the voltage on the input is higher or lower than said threshold; and a first transistor connected between the ground and said opposite terminal of the pair of programmable cells, said transistor being normally off and having a gate which can be driven to make it conduct, wherein said opposite terminal is connected to the supply voltage through a switching device controlled in a complementary manner with respect to said first transistor.

8. Programmable circuit according to claim 7, characterized in that said switching device is a fourth transistor.

* * * * *